United States Patent
Briere

(10) Patent No.: US 9,530,877 B2
(45) Date of Patent: *Dec. 27, 2016

(54) ENHANCEMENT MODE III-NITRIDE TRANSISTOR

(71) Applicant: Infineon Technologies Americas Corp., El Segundo, CA (US)

(72) Inventor: Michael A. Briere, Scottsdale, AZ (US)

(73) Assignee: Infineon Technologies Americas Corp., El Segundo, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/813,042

(22) Filed: Jul. 29, 2015

(65) Prior Publication Data

US 2015/0333165 A1 Nov. 19, 2015

Related U.S. Application Data

(63) Continuation of application No. 13/935,222, filed on Jul. 3, 2013, now Pat. No. 9,099,382, which is a
(Continued)

(51) Int. Cl.

| | |
|---|---|
| *H01L 29/778* | (2006.01) |
| *H01L 29/66* | (2006.01) |
| *H01L 29/205* | (2006.01) |
| *H01L 21/02* | (2006.01) |
| *H01L 21/768* | (2006.01) |
| *H01L 29/20* | (2006.01) |
| *H01L 29/423* | (2006.01) |
| *H01L 29/80* | (2006.01) |
| *H01L 29/51* | (2006.01) |

(52) U.S. Cl.
CPC ..... *H01L 29/7783* (2013.01); *H01L 21/02063* (2013.01); *H01L 21/76814* (2013.01); *H01L 29/2003* (2013.01); *H01L 29/205* (2013.01); *H01L 29/4232* (2013.01); *H01L 29/66431* (2013.01); *H01L 29/66462* (2013.01); *H01L 29/778* (2013.01); *H01L 29/7787* (2013.01);
(Continued)

(58) Field of Classification Search
CPC ........... H01L 29/2003; H01L 29/66462; H01L 29/778
See application file for complete search history.

(56) References Cited

U.S. PATENT DOCUMENTS 6,023,079 A * 2/2000 Hida .................. H01L 27/0605
257/192
6,521,961 B1 * 2/2003 Costa ................ H01L 21/28587
257/183
(Continued)

*Primary Examiner* — Evan Pert
(74) *Attorney, Agent, or Firm* — Murphy, Bilak & Homiller, PLLC

(57) ABSTRACT

According to one embodiment, a III-nitride transistor includes a conduction channel formed between first and second III-nitride bodies, the conduction channel including a two-dimensional electron gas. The transistor also includes at least one gate dielectric layer having a charge confined within to cause an interrupted region of the conduction channel and a gate electrode operable to restore the interrupted region of the conduction channel. The transistor can be an enhancement mode transistor. In one embodiment, the gate dielectric layer is a silicon nitride layer. In another embodiment, the at least one gate dielectric layer is a silicon oxide layer. The charge can be ion implanted into the at least one gate dielectric layer. The at least one gate dielectric layer can also be grown with the charge.

12 Claims, 4 Drawing Sheets

Related U.S. Application Data continuation of application No. 13/017,970, filed on Jan. 31, 2011, now Pat. No. 8,482,035, which is a continuation-in-part of application No. 11/460,725, filed on Jul. 28, 2006, now Pat. No. 8,183,595.

(60) Provisional application No. 61/337,929, filed on Feb. 12, 2010, provisional application No. 60/703,931, filed on Jul. 29, 2005.

(52) U.S. Cl.
CPC ............ H01L 29/803 (2014.09); *H01L 29/51* (2013.01); *H01L 29/518* (2013.01)

(56) References Cited

U.S. PATENT DOCUMENTS

| | | | | |
|---|---|---|---|---|
| 8,084,785 B2* | 12/2011 | Briere | ............... | H01L 29/4232 257/194 |
| 8,183,595 B2* | 5/2012 | Briere | ............... | H01L 29/4232 257/194 |
| 8,482,035 B2* | 7/2013 | Briere | ............... | H01L 29/2003 257/194 |
| 9,099,382 B2* | 8/2015 | Briere | ............... | H01L 29/2003 |
| 2003/0094649 A1* | 5/2003 | Hueting | ............. | H01L 29/0653 257/328 |
| 2004/0259384 A1* | 12/2004 | Nag | ................ | H01L 21/02131 438/788 |
| 2005/0014883 A1* | 1/2005 | Blankenship | .......... | C08F 2/001 524/458 |
| 2005/0145883 A1* | 7/2005 | Beach | ............... | H01L 29/7835 257/194 |
| 2006/0011915 A1* | 1/2006 | Saito | ............... | H01L 29/1066 257/65 |
| 2006/0102931 A1* | 5/2006 | Kopley | ............... | H01L 29/802 257/192 |
| 2007/0026587 A1* | 2/2007 | Briere | ............... | H01L 29/4232 438/159 |
| 2008/0179762 A1* | 7/2008 | Cho | ............... | H01L 29/42332 136/252 |

\* cited by examiner

US 9,530,877 B2

ENHANCEMENT MODE III-NITRIDE TRANSISTOR

This is a continuation of application Ser. No. 13/935,222 filed Jul. 3, 2013, which itself is a continuation of application Ser. No. 13/017,970, filed Jan. 31, 2011, now U.S. Pat. No. 8,482,035, which claims priority to U.S. Provisional Patent Application Ser. No. 61/337,929, filed Feb. 12, 2010. Further, said Ser. No. 13/017,970, filed Jan. 31, 2011 is a continuation in part of application Ser. No. 11/460,725, filed Jul. 28, 2006, now U.S. Pat. No. 8,183,595, which in turn claims priority to U.S. provisional application Ser. No. 60/703,931, filed Jul. 29, 2005. The disclosures in the above-referenced patent applications are hereby incorporated fully by reference into the present application.

BACKGROUND OF THE INVENTION

1. Field of the Invention

The present invention relates generally to a class of transistors based on III-nitride materials, and relates more particularly to enhancement mode III-nitride transistors.

2. Background Art

Transistors based on III-nitride heterojunction structures typically operate using piezoelectric polarization fields to generate a two-dimensional electron gas (2DEG) that allows for high current densities with low resistive losses. The 2DEG is formed at an interface of III-nitride materials and, due to the 2DEG, conventional III-nitride heterojunction transistors typically conduct without the application of a gate potential. Thus, transistors that are formed using III-nitride heterojunction structures tend to be nominally on, or depletion mode transistors.

III-nitride heterojunction transistors are desirable for power applications due to relatively high breakdown voltage, high current density, and low on resistance. However, the nominally on nature of conventional III-nitride heterojunction transistors can introduce problems when used in power applications. For example, in power applications it is desirable to avoid conducting current through III-nitride heterojunction transistors before control circuitry is fully powered and operational. Accordingly, it would be desirable to provide III-nitride heterojunction transistors that are nominally off, or enhancement mode transistors to, for example, avoid current conduction problems during start-up and other circuit conditions.

Thus, there is a need in the art for an effective III-nitride transistor configured as an enhancement mode, or nominally off transistor.

SUMMARY OF THE INVENTION

Enhancement mode III-nitride transistors with a single gate dielectric structure, substantially as shown in and/or described in connection with at least one of the figures, as set forth more completely in the claims.

DETAILED DESCRIPTION OF THE INVENTION

The present invention is directed to enhancement mode III-nitride transistors with a single gate dielectric structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
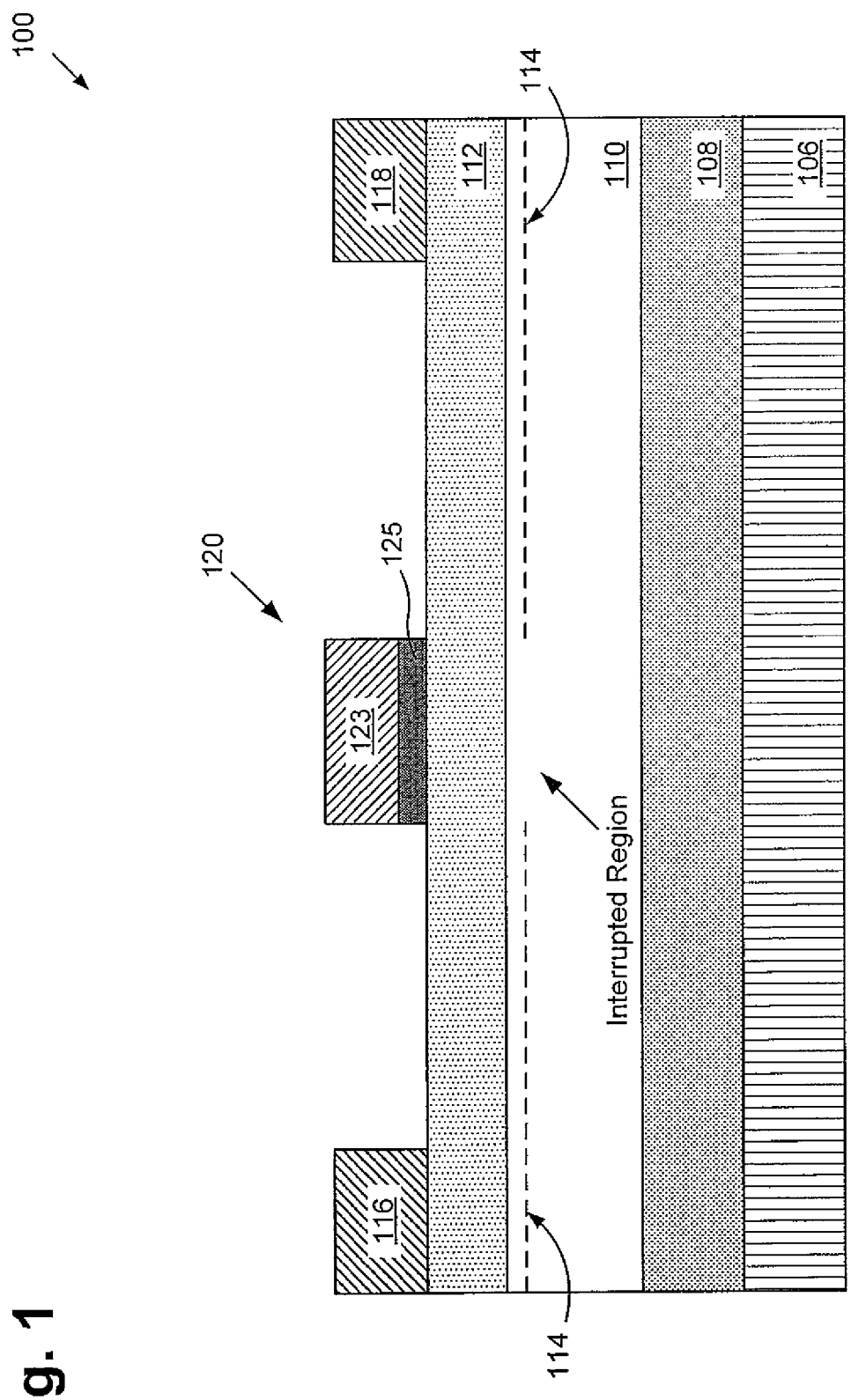
FIG. 1 shows a cross-sectional view of a III-nitride transistor, according to an embodiment of the invention.

Referring to FIG. 1, FIG. 1 shows a cross-sectional view of transistor 100, according to an embodiment of the invention. In the present embodiment transistor 100 is an enhancement mode III-nitride transistor. Transistor 100 comprises a III-nitride heterojunction high electron mobility transistor (HEMT) and includes substrate 106, transition body 108, III-nitride body 110, III-nitride body 112, current carrying electrodes 116 and 118, and gate structure 120.

As shown in FIG. 1, III-nitride body 110 can be formed over transition body 108 comprising, for example, AlN, which itself is formed over substrate 106. Transition body 108 can comprise a series of layers including GaN, AlGaN, AlN, and InGaAlN in various orders, and can relieve stress due to mismatch between a hetero-epitaxial layer and substrate 106. Substrate 106 can comprise materials such, as silicon carbide, silicon, sapphire and other suitable substrate materials. Substrate 106 can also comprise a bulk III-nitride material (e.g. bulk GaN) that is compatible with III-nitride body 110, in which case transition body 108 can be eliminated.

In FIG. 1, III-nitride body 110 of transistor 100 comprises III-nitride material, such as GaN and III-nitride body 112 comprises III-nitride material, such as AlGaN. As shown in FIG. 1, III-nitride body 110 is disposed over substrate 106 and III-nitride body 112 is disposed on III-nitride body 110 forming a conduction channel at an interface having two-dimensional electron gas (2DEG) 114. For example, III-nitride material in III-nitride body 110 can have a different in-plane lattice constant than III-nitride material in III-nitride body 112 such that the conduction channel including 2DEG 114 can form. It should be apparent that other III-nitride materials can be used to form transistor 100, such that, an interface of the III-nitride materials permits formation of the conduction channel having 2DEG 114 for current conduction.

During operation of transistor 100, current can be conducted between electrode 116 (which is preferably ohmically coupled to III-nitride body 112), and electrode 118 (which is also preferably ohmically coupled to III-nitride body 112) through the conduction channel having 2DEG 114. In some embodiments transistor 100 comprises a power transistor and electrodes 116 and 118 comprise power electrodes. Gate structure 120 is disposed between electrode 116 and electrode 118 to control current flow in the conduction channel having 2DEG 114. Conventional HEMTs are typically depletion mode transistors wherein, for example, upon start up, current can freely flow between current carrying electrodes through a conduction channel. However, in many applications it is desirable to provide an enhancement mode transistor.

In the present embodiment, transistor 100 includes gate structure 120 to cause an interrupted region of the conduction channel having 2DEG 114, whereby transistor 100 is rendered an enhancement mode transistor. As shown in FIG. 1, gate structure 120 includes gate electrode 123, which can comprise conductive material, and can be electrically insulated by gate dielectric layer 125 and thus can be capacitively coupled to III-nitride body 112. In transistor 100, gate structure 120 has a single gate dielectric layer 125 thereunder, for example, a silicon oxide layer, or a silicon nitride layer. As shown in FIG. 1, gate dielectric layer 125 is on III-nitride body 112 and on gate electrode 123.

In the present embodiment, gate structure 120 includes gate dielectric layer 125 to cause the interrupted region of the conduction channel having 2DEG 114. More particularly, a negative charge confined within gate dielectric layer 125 can interfere with 2DEG 114 in the conduction channel to cause the interrupted region. For example, in some embodiments the charge confined within gate dielectric layer 125 can be a negative charge such that electrons forming 2DEG 114 are repelled from the conduction channel to cause the interrupted region of the conduction channel. In other embodiments a positive charge confined within gate dielectric layer 125 can interfere with 2DEG 114 in the conduction channel to cause the interrupted region. Other embodiments can include other layers under gate electrode 123, for example, other gate dielectric layers, any of which may or may not include a charge confined therein. However, a single gate dielectric layer is preferred.

The charge confined within gate dielectric layer 125 interferes with 2DEG 114 in the conduction channel to set or program the threshold voltage of transistor 100 by repelling or attracting electrons respectively from or to the conduction channel. For example, in the present embodiment a particular amount of charge is confined within gate dielectric layer 125 to set the threshold voltage of transistor 100, whereby transistor 100 can be rendered an enhancement mode transistor, such that transistor 100 would be a depletion mode transistor without the charge. In other embodiments a particular amount of charge can be confined within gate dielectric layer 125 to set the threshold voltage of an already enhancement mode transistor 100. In yet other embodiments, a particular amount of charge can be confined within gate dielectric layer 125 to set the threshold voltage of an already depletion mode transistor 100 or to provide a depletion mode transistor 100, which would otherwise be an enhancement mode transistor.

Thus, as described above, the charge can be confined within gate dielectric layer 125 to cause the interrupted region of the conduction channel. As the present invention is directed toward a transistor, such as a power transistor, the charge is confined within gate dielectric layer 125 to maintain the set threshold voltage throughout operation of transistor 100. Furthermore, the charge is confined within gate dielectric layer 125 to maintain the set threshold voltage over an extended period, for example, over the operational lifetime of transistor 100.

In one embodiment, gate dielectric layer 125, having a single dielectric layer in the present embodiment, can be grown with the charge and then heated. Thus, for example, a single dielectric layer of silicon nitride or silicon oxide can be grown with negative charge. Gate dielectric layer 125 can also be formed by implanting dopants, for example, Fluorine, Bromine, Iodine, Chlorine, or the like into the single dielectric layer made of silicon nitride or silicon oxide. For example, Fluoride ions can be implanted into silicon nitride or silicon oxide gate dielectric layer 125. In some embodiments heat can then be applied to allow for damage recovery and charge migration. Thus, the charge can be dispersed throughout gate dielectric layer 125.

In transistor 100, application of appropriate voltage to gate electrode 123 can restore the interrupted region under gate structure 120. More particularly, in the present embodiment, gate electrode 123 can attract electrons to the conduction channel to restore the interrupted region. Thus, upon application of an appropriate voltage to gate electrode 123, current can be conducted between electrode 116 (which can be ohmically coupled to III-nitride body 112), and electrode 118 (which can also be ohmically coupled to III-nitride body 112) through the conduction channel having 2DEG 114. As such, the present embodiment can achieve a nominally off (or enhancement mode) III-nitride transistor that can be turned on by application of an appropriate voltage to gate electrode 123.

Thus, by providing gate dielectric layer 125 as described above, current-voltage characteristics of transistor 100 can be modified to obtain a nominally off device rather than a nominally on device. Accordingly, transistor 100 can operate in enhancement mode, rather than depletion mode, and can permit the use of transistor 100 as a high power switch that need not be compensated during start-up to avoid conducting current while control circuitry is powering up. Furthermore, because transistor 100 can comprise an enhancement mode device, transistor 100 can be used to control power delivery on start-up as well. That is, transistor 100 can be used as a logic power element to control power flow at start-up and during normal operation of a circuit.

It should be understood that transistor 100 according to the present invention can be formed over substrate 106 in any known manner (e.g. over transition body 108 formed on substrate 106) as a discrete power transistor, or can be formed with other transistors on a common substrate as a part of an integrated circuit.

Figure 2:
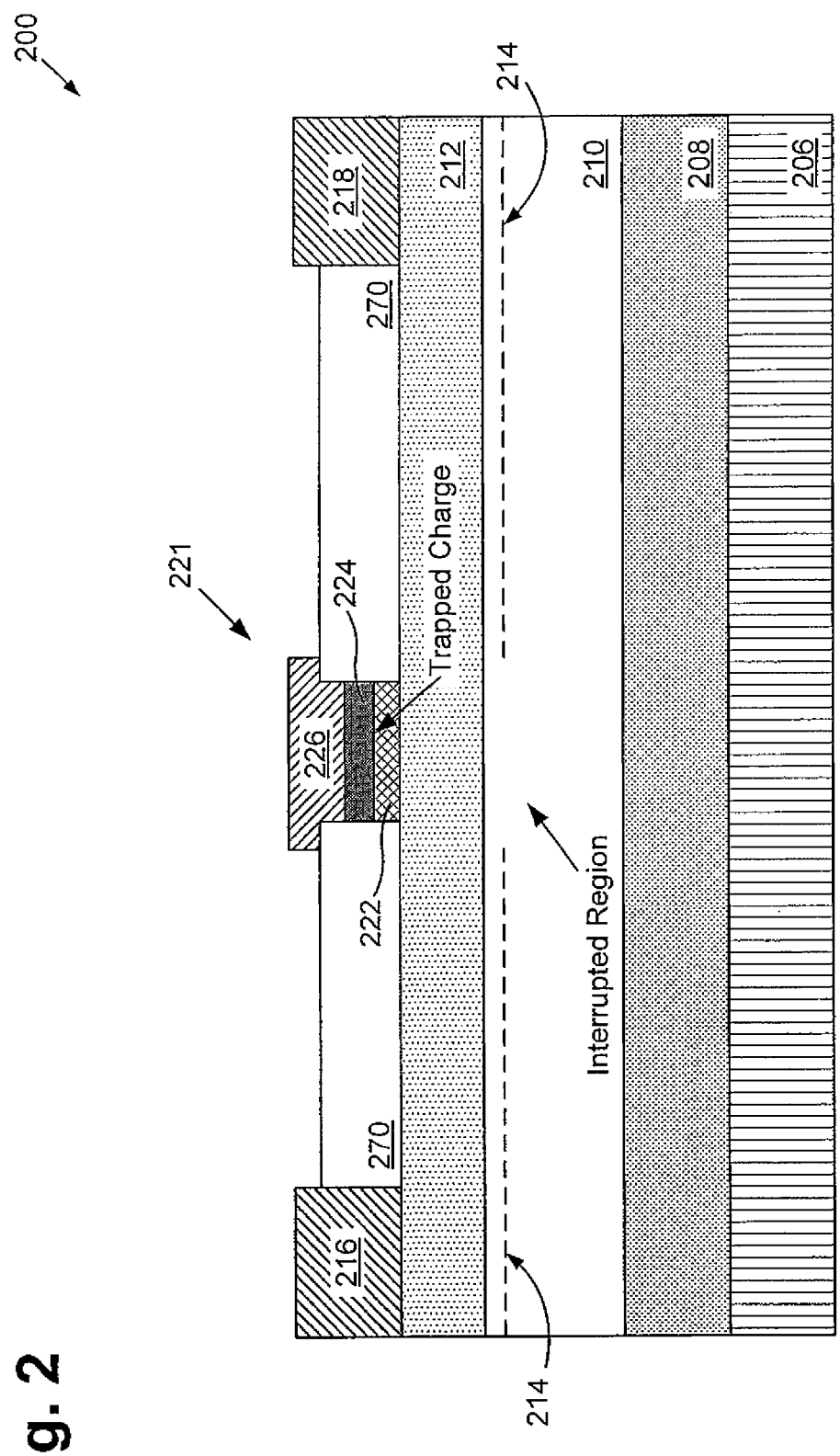
FIG. 2 shows a cross-sectional view of a III-nitride transistor, according to an embodiment of the invention.

Referring now to FIG. 2, FIG. 2 shows a cross-sectional view of transistor 200, according to an embodiment of the invention. Transistor 200 includes substrate 206, transition body 208, III-nitride body 210, III-nitride body 212, and current carrying electrodes 216 and 218, corresponding to substrate 106, transition body 108, III-nitride body 110, III-nitride body 112, and current carrying electrodes 116 and 118 in FIG. 1.

Transistor 200 also includes gate structure 221 comprising gate dielectric layer 222 on a portion of III-nitride body 212, gate dielectric layer 224 on gate dielectric layer 222, and gate electrode 226 on gate dielectric layer 224. Thus, in contrast to the embodiment described above which had only a single gate dielectric layer (gate dielectric layer 125), transistor 200 includes two gate dielectric layers. Field and/or passivation layer 227 can be provided as shown. According to one embodiment gate dielectric layer 222 and gate dielectric layer 224 can be selected to create a charge trap therebetween. Thus, as opposed to being confined within at least one of gate dielectric layer 222 and gate dielectric layer 224, in some embodiments the charge can be trapped at an interface between gate dielectric layer 222 and gate dielectric layer 224.

In some embodiments gate dielectric layer 222 can be silicon nitride and gate dielectric layer 224 can be silicon oxide. In other embodiments, gate dielectric layer 222 can be silicon oxide and gate dielectric layer 224 can be silicon nitride. It will be appreciated that other configurations are be possible.

As described above, the charge can be confined within at least one of gate dielectric layer 222 and gate dielectric layer 224 or the charge can be trapped at an interface between gate dielectric layer 222 and gate dielectric layer 224. Where the charge is trapped at an interface between gate dielectric layer 222 and gate dielectric layer 224, similar to transistor 100 as described above, the amount of charge trapped can be selected to cause an interrupted region of the conduction channel having 2DEG under gate electrode 226, thereby rendering transistor 200 an enhancement mode transistor. An application of an appropriate voltage to gate electrode 226 can restore the interrupted region and render transistor 200 on similar to transistor 100 as described above. Thus, a nominally off (or enhancement mode) switchable transistor can be obtained.

The charge can be confined within at least one of gate dielectric layers 222 and 224 similar to gate dielectric layer 125 described above. In order to trap the charge, in one embodiment, after fabrication, a bias can be applied to gate electrode 226 to generate negative charge. This can cause current to flow through gate dielectric layer 222 (e.g., through a tunneling mechanism), upon application of a sufficiently high applied electric field. This effect can be enhanced if the bias is applied while transistor 200 is heated. The application of heat can generate charge, which is trapped between gate dielectric layer 222 and gate dielectric layer 224. Temperature, applied voltage and time can be adjusted to affect the amount of charge that is generated and trapped.

In one embodiment, at least one of gate dielectric layers 222 and 224 can be grown with negative charge and then heated to allow the charge to migrate and become trapped between the two insulation bodies. Thus, for example, silicon nitride can be grown with negative charge for this purpose.

In another embodiment; Fluorine, Bromine, Iodine, Chlorine, or the like atoms can be implanted in at least one of the gate dielectric layers 222 and 224, followed by the application of heat in order to allow charge to migrate to the interface of gate dielectric layers 222 and 224.

In addition to being an enhancement mode transistor, transistor 200 is capable of having its threshold voltage set to a variety of desired threshold voltages similar to transistor 100 as described above. That is, the threshold voltage can be set by the selection of an appropriate amount of charge to be trapped between or confined within gate dielectric layers 222 and 224.

Also similar to transistor 100 described above, as the present invention is directed toward a transistor, the charge is confined within or trapped between gate dielectric layers 222 and 224 to maintain the set threshold voltage throughout operation of transistor 200. Furthermore, the charge is confined within or trapped between gate dielectric layers 222 and 224 to maintain the set threshold voltage over an extended period, for example, over the operational lifetime of transistor 200.

Furthermore, instead of only two gate dielectric layers, other layers, such as multiple gate dielectric layers can be stacked in order to reach a desired threshold voltage. Thus, transistor 200 can include under gate electrode 226, for example, any one or a combination of the following:
Silicon Oxide/Silicon Nitride;
Silicon Oxide/Silicon Nitride/Silicon Oxide;
Silicon Oxide/Silicon Nitride/Silicon Oxide/Silicon Nitride;
Silicon Nitride/Silicon Oxide;
Silicon Nitride/Silicon Oxide/Silicon Nitride;
Silicon Nitride/Silicon Oxide/Silicon Nitride/Silicon Oxide; and
any combination of the above.

Figure 3:
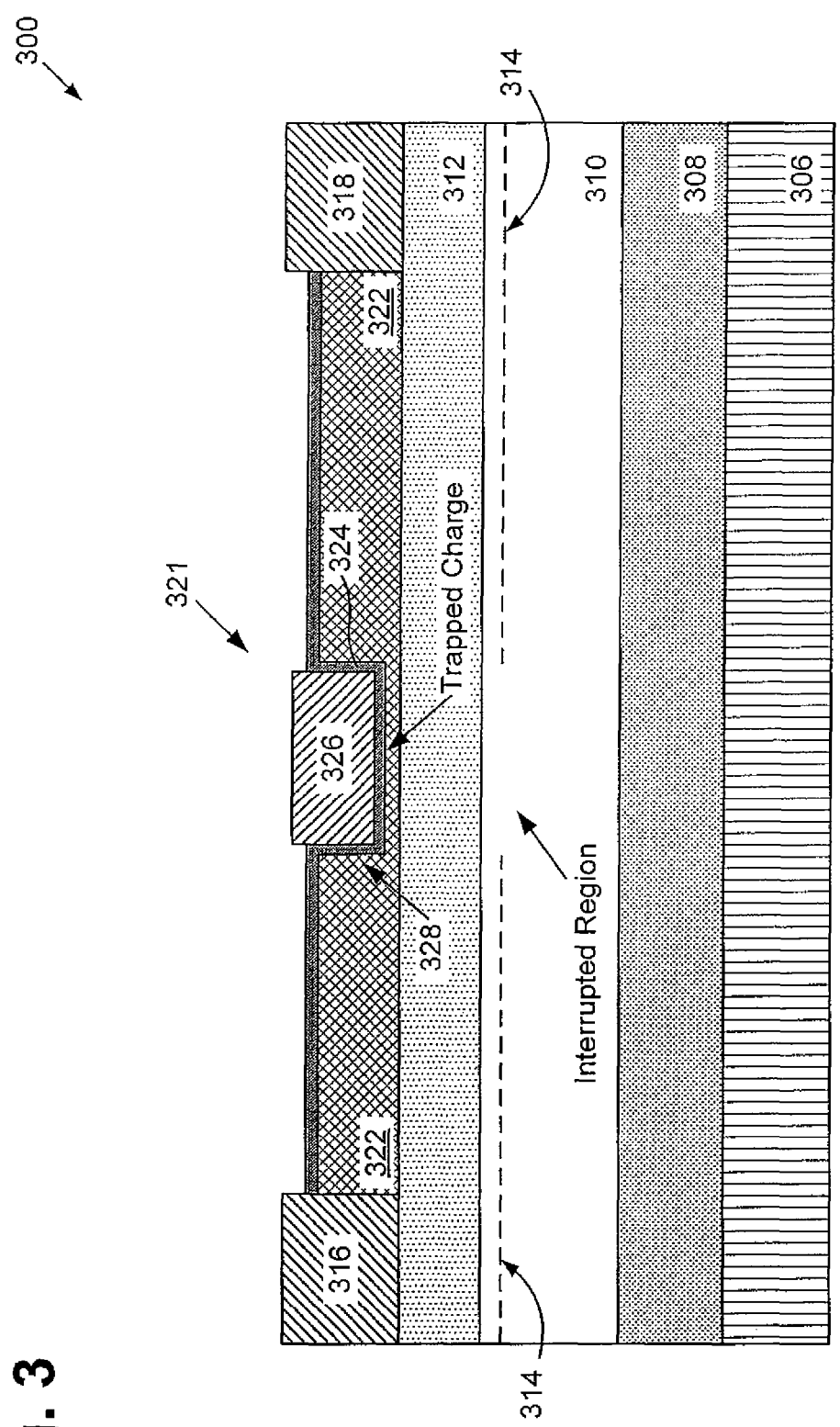
FIG. 3 shows a cross-sectional view of a III-nitride transistor, according to an embodiment of the invention.

Referring to FIG. 3, FIG. 3 shows a cross-sectional view of transistor 300, according to an embodiment of the invention. Transistor 300 includes substrate 306, transition body 308, III-nitride body 310, III-nitride body 312, current carrying electrodes 316 and 318, gate electrode 326, gate dielectric layer 322, and gate dielectric layer 324, which correspond to substrate 206, transition body 208, III-nitride body 210, III-nitride body 212, current carrying electrodes 216 and 218, gate electrode 226, gate dielectric layer 222, and gate dielectric layer 224 in FIG. 2.

Transistor 300 is similar to transistor 200, however, in transistor 300 gate dielectric layer 322 includes recess 328, gate dielectric layer 324 is formed over at least the bottom and the sidewalls of recess 328, and gate electrode 326 is be formed at least inside recess 328 over gate dielectric layer 324. In transistor 300, charge can be trapped between gate dielectric layer 322 and gate dielectric layer 324, preferably along the bottom and the sidewalls of recess 328. As a result, the area devoted to charge entrapment can be increased without increasing the lateral area covered by gate structure 321.

Figure 4:
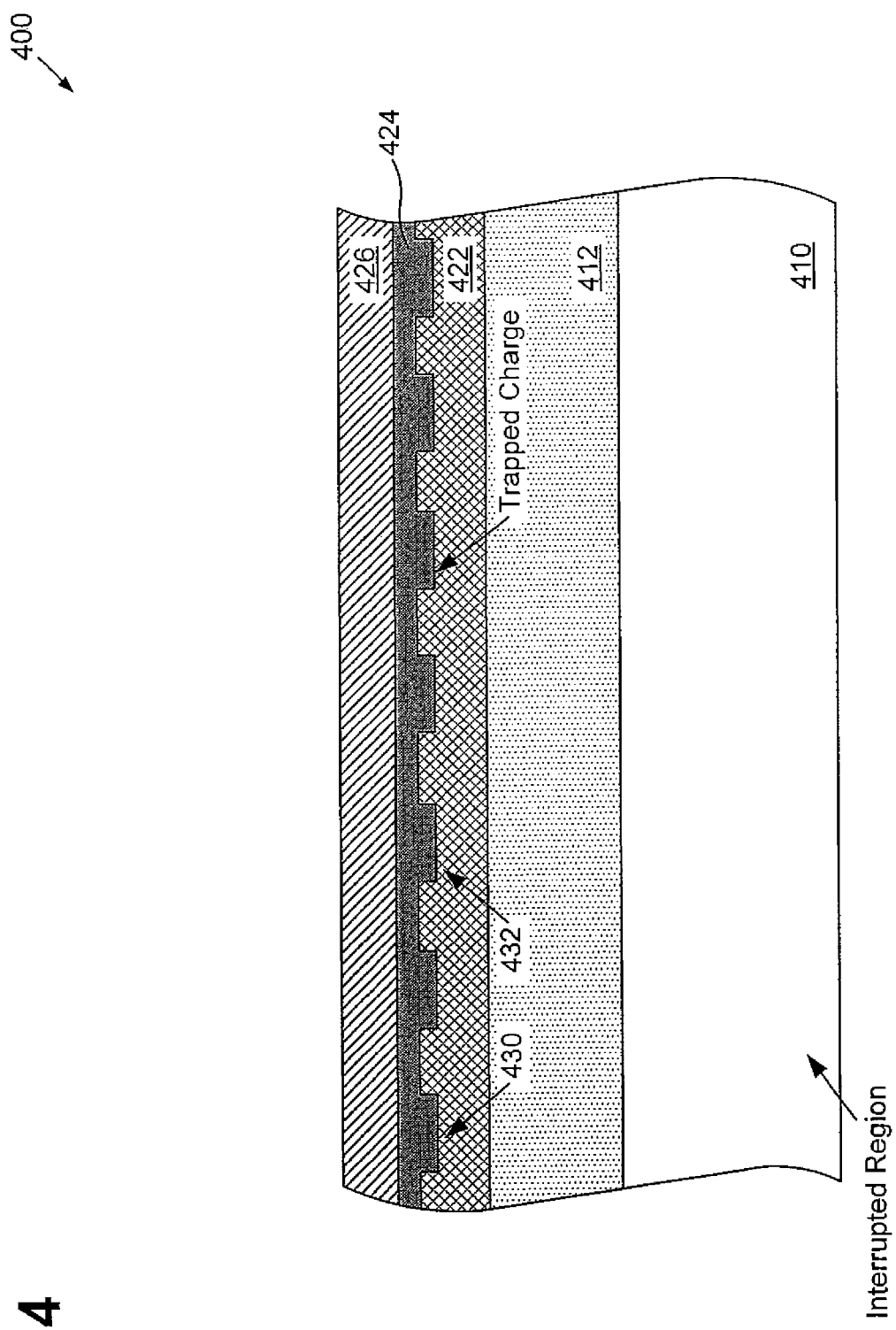
FIG. 4 shows a cross-sectional view of a III-nitride transistor, according to an embodiment of the invention.

Referring now to FIG. 4, FIG. 4 shows a cross-sectional view of transistor 400, which can correspond to an enhanced view of transistor 300, according to an embodiment of the invention. Transistor 400 includes III-nitride body 410, III-nitride body 412, gate electrode 426, gate dielectric layer 422, and gate dielectric layer 424, which correspond to III-nitride body 310, III-nitride body 312, gate electrode 326, gate dielectric layer 322, and gate dielectric layer 324 in FIG. 3.

In transistor 400, a plurality of spaced recesses, such as recesses 430 and 432, are formed in gate dielectric layer 422 instead of only one recess (e.g. recess 328 in FIG. 3) in order to further increase interface area between gate dielectric layer 422 and gate dielectric layer 424, and thus allow for larger charge trapping capacity between the two bodies.

Thus, as described above, according to various embodiments the present invention can provide for a transistor including at least one gate dielectric layer having a charge to cause an interrupted region of a conduction channel of the transistor. In some embodiments the charge can be confined within the at least one gate dielectric layer or trapped between the at least one gate dielectric layer and another gate dielectric layer to cause the interrupted region of the conduction channel. The transistor can further include a gate electrode operable to restore the interrupted region of the conduction channel. Thus, embodiments of the present invention can provide for an enhancement mode III-nitride transistor, which can, for example, be used as a power switch in power applications without the need to be compensated during start-up to avoid conducting current while control circuitry is powering up.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A III-nitride transistor comprising:
   a conduction channel formed between first and second III-nitride bodies, said conduction channel including a two-dimensional electron gas;
   at least one dielectric layer having a charge confined within to cause an interrupted region in said conduction channel.

2. The III-nitride transistor of claim 1 wherein at least one gate electrode is operable to restore said interrupted region of said conduction channel.

3. The III-nitride transistor of claim 1 wherein said transistor is an enhancement mode transistor.

4. The III-nitride transistor of claim 1 wherein said at least one dielectric layer is ion implanted with said charge.

5. The III-nitride transistor of claim 1 wherein said at least one dielectric layer is grown with said charge.

6. The III-nitride transistor of claim 1 wherein said first III-nitride body comprises AlGaN.

7. The III-nitride transistor of claim 1 wherein said second III-nitride body comprises GaN.

8. The III-nitride transistor of claim 1 wherein said at least one dielectric layer is on said first III-nitride body.

9. The III-nitride transistor of claim 1 wherein said at least one dielectric layer is under said at least one gate electrode.

10. The III-nitride transistor of claim 1 wherein said charge is a negative charge.

11. The III-nitride transistor of claim 1 wherein said charge is dispersed throughout said at least one dielectric layer.

12. The III-nitride transistor of claim 1 wherein said first III-nitride body comprises AlGaN and said second III-nitride body comprises GaN.

* * * * *